US008410821B2

(12) United States Patent
Ohara et al.

(10) Patent No.: US 8,410,821 B2
(45) Date of Patent: Apr. 2, 2013

(54) OUTPUT CURRENT DETECTING CIRCUIT AND TRANSMISSION CIRCUIT

(75) Inventors: Tomomitsu Ohara, Tama (JP); Takafumi Goto, Tama (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 151 days.

(21) Appl. No.: 12/942,239

(22) Filed: Nov. 9, 2010

(65) Prior Publication Data

US 2011/0115530 A1 May 19, 2011

(30) Foreign Application Priority Data

Nov. 13, 2009 (JP) ................................ 2009-259467

(51) Int. Cl.
*H03K 5/153* (2006.01)

(52) U.S. Cl. ......................................... 327/77; 327/543

(58) Field of Classification Search .................... 327/77, 327/543, 72, 81, 541

See application file for complete search history.

(56) References Cited

U.S. PATENT DOCUMENTS 3,859,586 A 1/1975 Wadlington
5,563,502 A * 10/1996 Akioka et al. ................ 323/313
5,629,614 A * 5/1997 Choe et al. .................... 323/315
5,828,308 A * 10/1998 Fukami ......................... 340/664
6,587,000 B2 * 7/2003 Oikawa ......................... 330/288
6,788,088 B2 * 9/2004 Throngnumchai ........ 324/750.3
7,659,706 B2 * 2/2010 Nishida ......................... 323/314
7,667,506 B2 * 2/2010 Mawet .......................... 327/142
2003/0184326 A1 * 10/2003 Throngnumchai ........... 324/713
2007/0182400 A1 * 8/2007 Finney .......................... 323/315
2008/0225456 A1 9/2008 Daio et al.
2009/0206807 A1 8/2009 Imura et al.

FOREIGN PATENT DOCUMENTS

JP 05-315852 A 11/1993
JP 2006-079517 A 3/2006
JP 2006-164089 A 6/2006
JP 2007-028897 A 2/2007
JP 2007-195007 A 8/2007

OTHER PUBLICATIONS

Extended European Search Report (EESR) dated May 20, 2011 (in English) in counterpart European Application No. 10190585.9.

* cited by examiner

*Primary Examiner* — Quan Tra
(74) *Attorney, Agent, or Firm* — Holtz, Holtz, Goodman & Chick, P.C.

(57) ABSTRACT

An output current detecting circuit includes: a current detecting transistor having a size smaller than that of an output transistor and a control terminal, to which a voltage same as a control voltage of the output transistor is applied; a sensing resistor connected to the current detecting transistor in a serial mode; a comparison circuit comparing a voltage converted by the sensing resistor and a reference voltage to judge a magnitude of a current flowing through the output transistor; and a reference voltage generating circuit, wherein the reference voltage generating circuit includes a constant current circuit flowing a constant current and a resistance element having one terminal connected to a power source voltage terminal, the reference voltage generating circuit generating the reference voltage based on a power source voltage by the conversion of the constant current into a voltage by flowing the constant current through the resistance element.

6 Claims, 6 Drawing Sheets

OUTPUT CURRENT DETECTING CIRCUIT AND TRANSMISSION CIRCUIT

BACKGROUND OF THE INVENTION

1. Field of the Invention

The present invention relates to an output current detecting circuit losing little electric power, an output current detecting circuit being scarcely influenced by power supply voltage variations and temperature variations, and a transmission circuit equipped with one of the output current detecting circuits.

2. Description of Related Art

A home bus system (HBS) exists as a communication standard between household electrical appliances. The HBS includes a standard regulating the use of twisted-pair lines for a transmission path and the use of an alternate mark inversion (AMI) coded signal (hereinafter referred to as an AMI signal) for the transmission of a digital signal on the transmission path. An AMI signal is composed of three values of zero, plus, and minus, and data is transmitted in the way of expressing logic “0” by a zero and logic “1” by alternating the polarity of the signal in communication using the signal. A transmission waveform hereby becomes close to that of an alternating current signal, and the AMI signal has the advantages of being tolerant of noise and of enabling stable data transmission. In addition, the polarities of the logic “1” are positive and negative polarities to the electric potential of the logic “0,” and the electric potential of the logic “0” is not limited to 0 V. For example, 5 V may be selected as the electric potential of the logic “0.”

An HBC driver/receiver integrated circuit (IC) (semiconductor integrated circuit) has conventionally been provided as a device that is mounted on a piece of equipment constituting a system, to which HBS is applied, and bears the communication function between pieces of equipment. A transmission circuit generating an AMI signal to transmit the generated AMI signal onto a transmission line is incorporated into the IC in addition to a receiving circuit judging the logic level of an AMI signal on a transmission line to reproduce received data, and the transmission circuit is equipped with an output drive circuit to drive the transmission line and a transmission gate control circuit controlling the output drive circuit on the basis of transmission data (see, for example, Japanese Patent Application Laid-Open Publications No. H 5-315852 and No. 2007-195007). The output drive circuit here uses a power transistor capable of flowing a large current as the output transistor thereof in order to enable driving a transmission line, the length of which is sometimes several tens of meters or more.

In a system to which HBS is applied, several tens of pieces of equipment are sometimes connected to one transmission path. For example, several tens of pieces of indoor equipment (expanders and heat exchangers) are sometimes connected to one or several pieces of outdoor equipment (compressors and radiators) through a transmission path in an air conditioning system of a building, and an HBC driver/receiver IC is mounted on each piece of equipment. In such an HBS system, a situation in which the driver/receiver ICs of a plurality of pieces of equipment simultaneously perform transmission sometimes occurs. To put it concretely, there may be a case where, when the transmission circuit of a certain driver/receiver IC tries to output a positive logic signal, the transmission circuit of another driver/receiver IC happens to try to output a negative logic signal.

In such a case, it is apprehended that a very large current flows through the output transistor of the transmission circuit trying to output a positive logic signal and the output transistor may be broken in some cases. Accordingly it is preferable that a current detecting circuit detecting a current flowing through an output drive circuit is incorporated, and that, if the current detecting circuit detects that a current equal to or more than a predetermined value flows through the output drive circuit, the transmission gate control circuit stops the output operation of the output drive circuit. The inventors of the present invention devised a circuit shown in FIG. 6 as a transmission circuit having such a function, and examined the circuit.

The circuit shown in FIG. 6 is composed of an output drive circuit 11 driving a transmission line to output a AMI-coded data signal, a gate control circuit 12 generating control signals for performing the on-off control of the respective transistors Q1 and Q2 of the output drive circuit 11 on the basis of transmission data, and an output current detecting circuit 13 including a comparator comparing the voltage of a current detecting resistor Rs connected between a power source voltage terminal VDD and the output transistor Q1 with a reference voltage Vref to detect whether a current equal to or more than a predetermined current value (excess current) is flowing or not.

The output drive circuit 11 is composed of a p-channel type power metal oxide semiconductor (MOS) transistor Q1 and an n-channel type power MOS transistor Q2, each made of an insulated-gate field-effect transistor (hereinafter referred to as a MOS transistor), both connected in series with each other between the power source voltage terminal VDD and a ground potential point GND. Furthermore, the circuit of FIG. 6 is configured in such a way that, when a current equal to or more than the predetermined current value flows through the output transistor Q1 and the voltage dropped by the current detecting resistor Rs becomes lower than the reference voltage Vref, the output current detecting circuit 13 transmits a detection signal to the gate control circuit 12, and that the gate control circuit 12 controls both the output transistors Q1 and Q2 into their turned-off states to prevent the flow of the excess current.

Because a relatively large current flows through the current detecting resistor Rs (hereinafter referred to as a sensing resistor) provided in series with the output transistor Q1 in the output current detecting circuit of FIG. 6, the power loss thereof is large and the power consumption thereof becomes much. Consequently, when a chip temperature rises owing to the heat generation of the sensing resistor Rs to exceed a package allowable temperature, it is apprehended that the device is broken. Although the power loss of the sensing resistor Rs can be reduced, here, by using a low resistance element, it is difficult by the present process technique to obtain a highly accurate low resistance element on a semiconductor chip on which the output current detecting circuit is formed, and, if the resistance value of the sensing resistor Rs disperses, an excess current detection level results in dispersing.

Furthermore, because the p-channel type MOS transistor, having a device size larger than that of the n-channel type MOS transistor of the same drive power, is used as the output transistor Q1 in the output current detecting circuit of FIG. 6, the output current detecting circuit has the problem in which the occupation area of the output circuit, the chip size thereof by extension, is large. In addition, the invention pertaining to a detection circuit configured to be able to detect an excess current without causing any large power losses by providing a current detecting transistor connected to an output transistor through which a large drive current is flown in a current mirror connection is described in, for example, Patent Literatures 1 and 2.

SUMMARY OF THE INVENTION

The present invention was made in view of the aforesaid problem, and aims to provide an output current detecting circuit capable of suppressing the power loss in a sensing resistor and thereby suppressing the rise of a chip temperature and a transmission circuit equipped with the output current detecting circuit.

Another object of the present invention is to provide an output current detecting circuit made as a semiconductor integrated circuit capable of reducing the occupation area of the output circuit thereof, the chip size by extension and a transmission circuit equipped with the output current detecting circuit.

The other object of the present invention is to provide an output current detecting circuit having low power source voltage dependency and low temperature dependency and a transmission circuit equipped with the output current detecting circuit.

In order to achieve the above objects, according to an aspect of the present invention, an output current detecting circuit, includes:

an output circuit including an output transistor connected between a power source voltage terminal and an output terminal;

a current detecting transistor having a size smaller than that of the output transistor and a control terminal, to which a voltage same as that applied to a control terminal of the output transistor is applied to flow a current according to the size through the current detecting transistor;

a first resistance element connected to the current detecting transistor in a serial mode;

a comparison circuit for comparing a voltage converted by the first resistance element and a predetermined reference voltage to judge a magnitude of a current flowing through the output transistor; and a reference voltage generating circuit for generating the reference voltage, wherein the reference voltage generating circuit includes a constant current circuit flowing a constant current and a second resistance element having one terminal connected to the power source voltage terminal, the reference voltage generating circuit generating the reference voltage based on a power source voltage at the power source voltage terminal by converting the constant current generated by the constant current circuit into a voltage by flowing the constant current through the second resistance element.

According to the configuration described above, if the size of the current detecting transistor is set to 1/N of the size of the output transistor, an output current value can be detected only by flowing a current into the first resistance element as the sensing resistor connected in series with the current detecting transistor, the magnitude of which current is 1/N of the current flowing through the output transistor, and consequently the power loss of the sensing resistor can greatly be reduced. Furthermore, because the configuration generates the reference voltage based on the power source voltage, a relative judgment level does not change even if the power source voltage changes, and the judgment accuracy of the comparison circuit can be improved.

Preferably, here, each of the output transistor and the current detecting transistor is made of an n-channel type field-effect transistor. The size of the device, the chip area by extension, can be reduced in comparison with that of the case where the output transistor is composed of a p-channel type MOS transistor.

Furthermore, preferably, the output current detecting circuit is configured to further comprises a first MOS transistor connected between the constant current circuit and the second resistance element, the first MOS transistor having a gate terminal to which a voltage same as that applied to a gate terminal of the current detecting transistor is applied. Hereby, if a drain current (detection current) changes owing to a change of the drain-source voltage of a current detecting MOS transistor caused by a change of the power source voltage, the drain-source voltage of the first MOS transistor, having the gate terminal to which the voltage same as the gate voltage of the current detecting MOS transistor is applied, is similarly changes, and consequently the changes of the drain current can be made to have the same characteristic to enable the changes of the current flowing through the second resistance element and further the changes of the reference voltage to be small.

Furthermore, preferably, the constant current circuit includes: a second MOS transistor serially connected to the second resistance element and the first MOS transistor; a current mirror circuit connected to a constant current source and the power source voltage terminal, through which current mirror circuit a current flows in proportion to that of the constant current source; and a current-voltage conversion circuit for converting a current transferred by the current mirror circuit to a voltage to generate a bias voltage to be applied to a gate terminal of the second MOS transistor. Hereby, because the current of the constant current source is converted into a voltage by being reflected by the current mirror circuit to generate a bias voltage applied to the gate terminal of the second MOS transistor, a stable current independent of the variations of the power source voltage can be flown through the second resistance element, and the variations of the reference voltage can be suppressed.

Furthermore, preferably, the constant current source includes: an operational amplifier having a first input terminal to which a standard voltage having no temperature characteristic is applied; and a third MOS transistor and a third resistance element serially connected between a transistor of a transfer source of the current mirror circuit and a constant potential point, wherein an output voltage of the operational amplifier is applied to the gate terminal of the third MOS transistor, and electric potential at a connection node of the third MOS transistor and the third resistance element is fed back to a second input terminal of the operational amplifier. Hereby, because the constant current source is equipped with the third MOS transistor and the third resistance element connected in series with each other between the operational amplifier and the transistor of the transfer source of the current mirror circuit, the temperature characteristic of the reference voltage as a current detection level of the current supplied to the comparison circuit made to be constant by suitably selecting the characteristic of the third resistance element, or a desired temperature characteristic can be given. The stable detection of an excess current can thereby be enabled even if temperature variations occur.

Furthermore, preferably, each of the first resistance element and the second resistance element is a resistor of a same type; and the current detecting transistor and the first MOS transistor are adapted to make currents having current densities same as each other flow through them when an excess current state is detected by the comparison circuit. Hereby, a stable current independent of the variations of the power source voltage can be flown through the second resistance element, and the variations of the reference voltage can be suppressed.

Furthermore, a transmission circuit according to another aspect of the present invention includes:

an output circuit including a first output transistor and a second output transistor connected between a power source voltage terminal and a constant potential point in a serial mode;

a gate control circuit for generating a pair of AMI-coded control signals to be supplied to control terminals of the first output transistor and the second output transistor, respectively;

a current detecting transistor having a size smaller than those of the output transistors, and a control terminal, to which a voltage same as those applied to control terminals of the output transistors is applied to flow a current according to the size through the current detecting transistor;

a first resistance element connected to the current detecting transistor in a serial mode;

a comparison circuit for comparing a voltage converted by the first resistance element and a predetermined reference voltage to judge a magnitude of a current flowing through the output transistors; and a reference voltage generating circuit for generating the reference voltage, wherein the reference voltage generating circuit includes a constant current circuit flowing a constant current and a second resistance element having one terminal connected to the power source voltage terminal, the reference voltage generating circuit generating the reference voltage based on a power source voltage to be applied to the power source voltage terminal by converting the constant current generated by the constant current circuit into a voltage by flowing the constant current through the second resistance element; and an output of the comparison circuit is supplied to the gate control circuit, which generates control signals for turning off both the first output transistor and the second output transistor when the current flowing through the output transistors exceeds a predetermined current value.

According to the configuration described above, a current flowing through the sensing resistor can be made to be small, and thereby the power loss of the sensing resistor can greatly be made to be reduced. Furthermore, if a current equal to or more than a predetermined value flows through the output transistor, the current is detected and the output transistor is turned off. Thereby, the breakage of the output transistor caused by an excess current can be prevented. Furthermore, because the configuration generates the reference voltage based on the power source voltage, the relative judgment level does not vary if the power source voltage varies, and the judgment accuracy of the comparison circuit can be improved.

According to the present invention, the following effects can be obtained. An output current detecting circuit capable of suppressing the power loss of a sensing resistor to suppress the rise of a chip temperature and a transmission circuit equipped with the output current detecting circuit can be realized. Furthermore, an output current detecting circuit made to be a semiconductor integrated circuit capable of reducing the occupation area of an output circuit, a chip size by extension, and a transmission circuit equipped with the output current detecting circuit can be realized. Furthermore, an output current detecting circuit having low power source voltage dependency and low temperature dependency and a transmission circuit equipped with the output current detecting circuit can be realized.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein.

DESCRIPTION OF THE PREFERRED EMBODIMENTS

In the following, the preferable embodiments of the present invention will be described with reference to the accompanying drawings.

Figure 1:
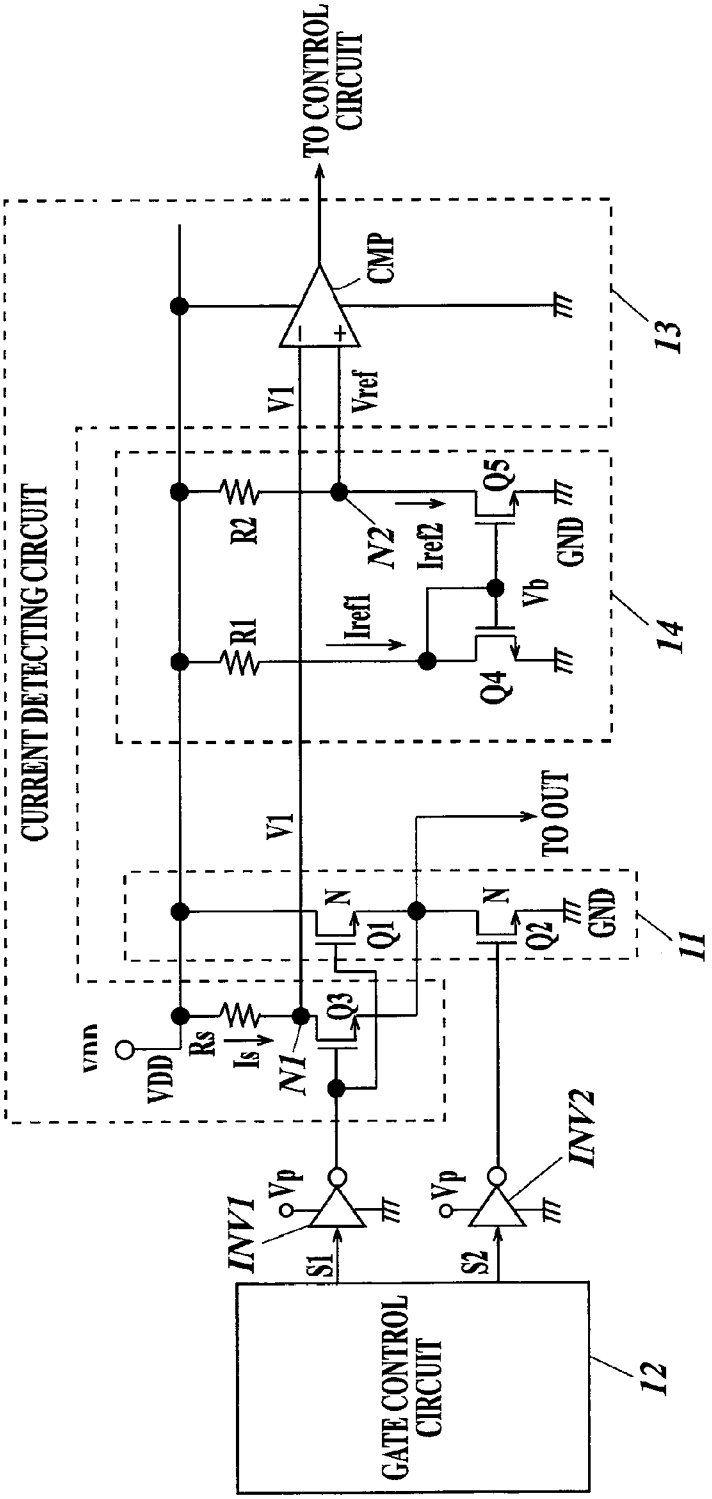
FIG. 1 is a circuit diagram showing a first embodiment in the case where the present invention is applied to a transmission circuit to be incorporated in an HBC driver/receiver IC.

FIG. 1 shows a first embodiment of a transmission circuit to be incorporated in an home bus system (HBS) driver/receiver IC mounted in a piece of equipment constituting a system to which the HBS is applied, the HBS driver/receiver IC bearing the communication function between pieces of equipment. In addition, FIG. 1 shows a circuit on one side of driving one of twisted-pair lines, and a real transmission circuit of the IC is provided with one more circuit as shown in FIG. 1 for outputting an AMI-coded signal having a different polarity.

The transmission circuit of the present embodiment is equipped with output transistors Q1 and Q2 connected in series with each other between a power source voltage terminal VDD and a ground potential point GND; the output drive circuit 11 as a push-pull type output circuit, which drives the transmission line to output an AMI-coded data signal; the gate control circuit 12 generating control signals S1 and S2 for performing the on-off control of the transistors Q1 and Q2, respectively, in the output drive circuit 11 on the basis of transmission data; the output current detecting circuit 13 detecting whether a current equal to or more than a predetermined current value (excess current) is flowing through the output drive circuit 11 or not on the basis of the reference voltage Vref; and a reference voltage generating circuit 14 generating the reference voltage Vref. An output terminal OUT coupled to a signal line constituting the transmission line is connected to the connection node of the output transistors Q1 and Q2.

Although it is not particularly limited, the output drive circuit 11 uses n-channel type power MOS transistors as the output transistors Q1 and Q2. If a p-channel MOS transistor and an n-channel MOS transistor, both manufactured by the present complementary metal oxide semiconductor (CMOS) manufacturing process, are compared with each other, it is known that the n-channel MOS transistor has a current driving force larger than that of the p-channel MOS transistor by about three times if they have the same sizes.

Accordingly, by using the n-channel type power MOS transistor as the output transistor Q1 of the output drive circuit 11 as described above, the size of the device, the chip area of the IC by extension, can be made to be smaller in comparison with the case where the same current driving force is realized with the p-channel type power MOS transistor. In addition, if the n-channel type MOS transistor is used as the output transistor Q1 like the present embodiment, it is preferable to provide a boosting circuit in order to sufficiently decrease the on-resistance at the time of turning on the output transistor Q1 to provide a voltage Vp, which is a boosted power source voltage VDD of the IC, to the power source voltage terminals of inverters INV1 and INV2 driving the gate terminals of the output transistors Q1 and Q2, respectively, at their preceding stages.

The output current detecting circuit 13 is equipped with a MOS transistor Q3 having a gate terminal, to which the voltage same as the gate voltage of the output transistor Q1 on the power source voltage terminal VDD side is applied, and a source terminal commonly connected with the source terminal of the output transistor Q1, the MOS transistor Q3 constitutes a current mirror circuit with the output transistor Q1 by being connected as described above; the current detecting sensing resistor Rs connected to the MOS transistor Q3 in series with each other; and a comparator CMP as a comparison circuit comparing the voltage V1 at the connection node N1 of the sensing resistor Rs and the MOS transistor Q3 with the reference voltage Vref to judge the magnitude of the voltage V1.

Then, the output current detecting circuit 13 is configured in such a way that, when a current equal to or more than a predetermined current value flows through the output transistor Q1 and the voltage dropped by the current detecting resistor Rs becomes lower than the reference voltage Vref, the output (detection signal) of the comparator CMP is changed from a low level to a high level. The gate control circuit 12 is configured in such away that, when the detection signal changes to the high level, the gate control circuit 12 outputs the control signals S1 and S2 for turning off both the output transistors Q1 and Q2, respectively, to the output drive circuit 11.

Figure 6:
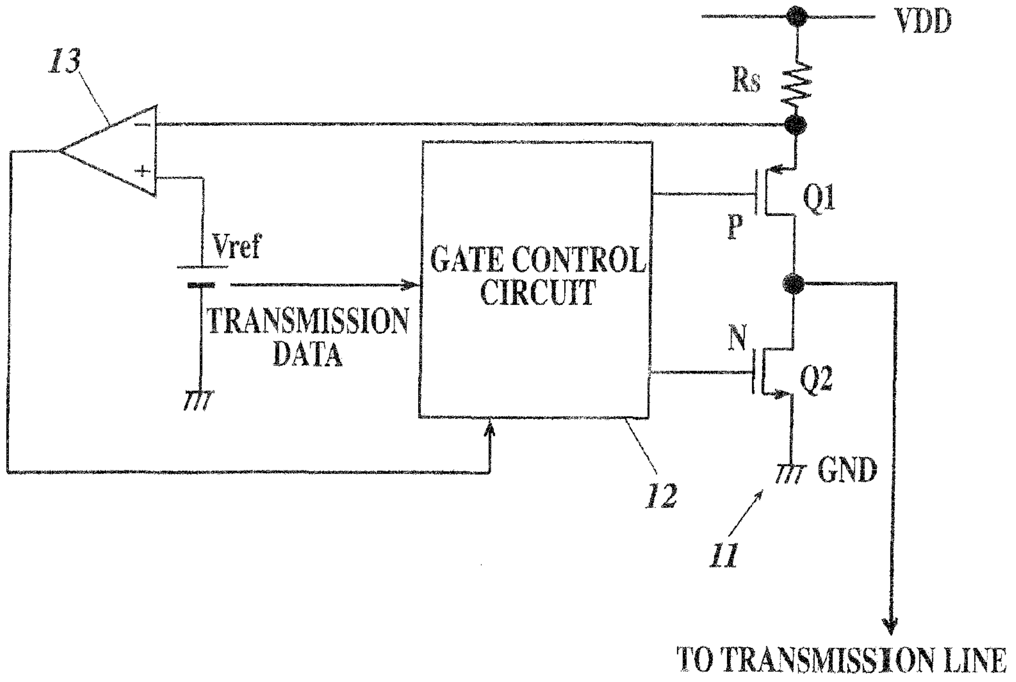
FIG. 6 PRIOR ART
FIG. 6 is a circuit diagram showing the configuration of a transmission circuit to be incorporated in an HBC driver/receiver IC, which transmission circuit has been examined before the present invention.

In the present embodiment, the size (gate width W or W/L where L denotes a gate length) of the MOS transistor Q3 of the output current detecting circuit 13 is designed to be 1/N of the size (gate width W or W/L) of the output transistor Q1. L denotes a gate length. The output current value can, hereby, be detected only by flowing a current of the magnitude of 1/N of the current flowing through the output transistor Q1 into the MOS transistor Q3 and the sensing resistor Rs serially connected to the MOS transistor Q3. The power loss in the sensing resistor Rs can greatly be decreased in comparison with the case where the sensing resistor Rs is connected to the output transistor Q1 in series with each other as shown in FIG. 6. As a result, the rise of the chip temperature can be suppressed, and it can be prevented that the chip temperature exceeds the package allowable temperature to break the device. In addition, N is considered to be, for example, a value of "10," but N may take a value larger than "10."

The reference voltage generating circuit 14 is composed of a resistor R1 connected between the power source voltage terminal VDD and the ground potential point GND in a serial mode; a MOS transistor Q4 connected in the so-called diode connection, in which the gate thereof and the source thereof are coupled to each other; a constant current flowing MOS transistor Q5 connected to the MOS transistor Q4 in a current mirror connection; and a current-voltage converting resistor R2 connected between the drain terminal of the MOS transistor Q5 and the power source voltage terminal VDD in a serial mode. In addition, the resistor R1 and the MOS transistor Q4 can be regarded as a bias circuit giving a bias voltage Vb to the gate terminal of the constant current flowing MOS transistor Q5 for driving the MOS transistor by a constant voltage. Then, a constant current circuit is composed of the bias circuit and the constant current flowing MOS transistor Q5 flowing a current according to the bias voltage Vb generated by the bias circuit through the MOS transistor Q5.

The reference voltage generating circuit 14 of the present embodiment is configured to generate the reference voltage Vref based on the power source voltage VDD by converting the constant current generated by the constant current flowing MOS transistor Q5 into a voltage by flowing the constant current through the resistor R2. Consequently, the judgment accuracy of the comparator CMP in the output current detecting circuit 13 can be improved. The reason is that, if the power source voltage VDD varies, the electric potential V1 at the connection node N1 of the sensing resistor Rs and the MOS transistor Q3 varies, but the reference voltage Vref also varies according to the variations of the power source voltage and thereby the relative judgment level can be held to be almost constant independent of the variations of the power source voltage VDD.

Now, the reference voltage generating circuit 14 of the embodiment (FIG. 1) has a disadvantage that the power source voltage dependency thereof and the temperature dependency thereof are not improved sufficiently. In the following, the reason is described. That is, the reference voltage generating circuit 14 of FIG. 1 has the advantage that the circuit configuration thereof is simple and the number of the elements is also small, but has the disadvantage that the variations of the power source voltage VDD also vary the current Iref2 flowing through the resistor R2 and the MOS transistor Q5, the reference voltage Vres by extension, because the reference voltage generating circuit 14 is configured in such a way that, if the power source voltage VDD varies, the current Iref1 flowing through the resistor R1 and the MOS transistor Q4 varies.

Furthermore, because the bias state of the MOS transistor Q3 of the output current detecting circuit 13 and the bias state of the MOS transistor Q5 are different from each other in the reference voltage generating circuit 14 of FIG. 1, even if the MOS transistors Q3 and Q5 are designed to have the same sizes, the pieces of impedance of the MOS transistors Q3 and Q5 are different from each other owing to the difference of the drain-source voltages VDS of the MOS transistors Q3 and Q5, and the reference voltage generating circuit 14 has the disadvantage that different current variations are generated between the current Is of the MOS transistor Q3 and the current Iref2 of the MOS transistor Q5 owing to the variations of the power source voltage. Furthermore, in the reference voltage generating circuit 14 of FIG. 1, the reference voltage Vref varies according to the temperature coefficient of the current-voltage converting resistor R2 and the temperature characteristic of the current Iref2 of the MOS transistor Q5. That is, the reference voltage Vref has temperature dependency. Consequently, the reference voltage generating circuit 14 has the disadvantage that the excess current judgment level by the comparator CMP varies owing to temperature variations.

Next, a second embodiment of a transmission circuit equipped with a reference voltage generating circuit having improved power source voltage dependency and improved temperature dependency will be described.

Figure 2:
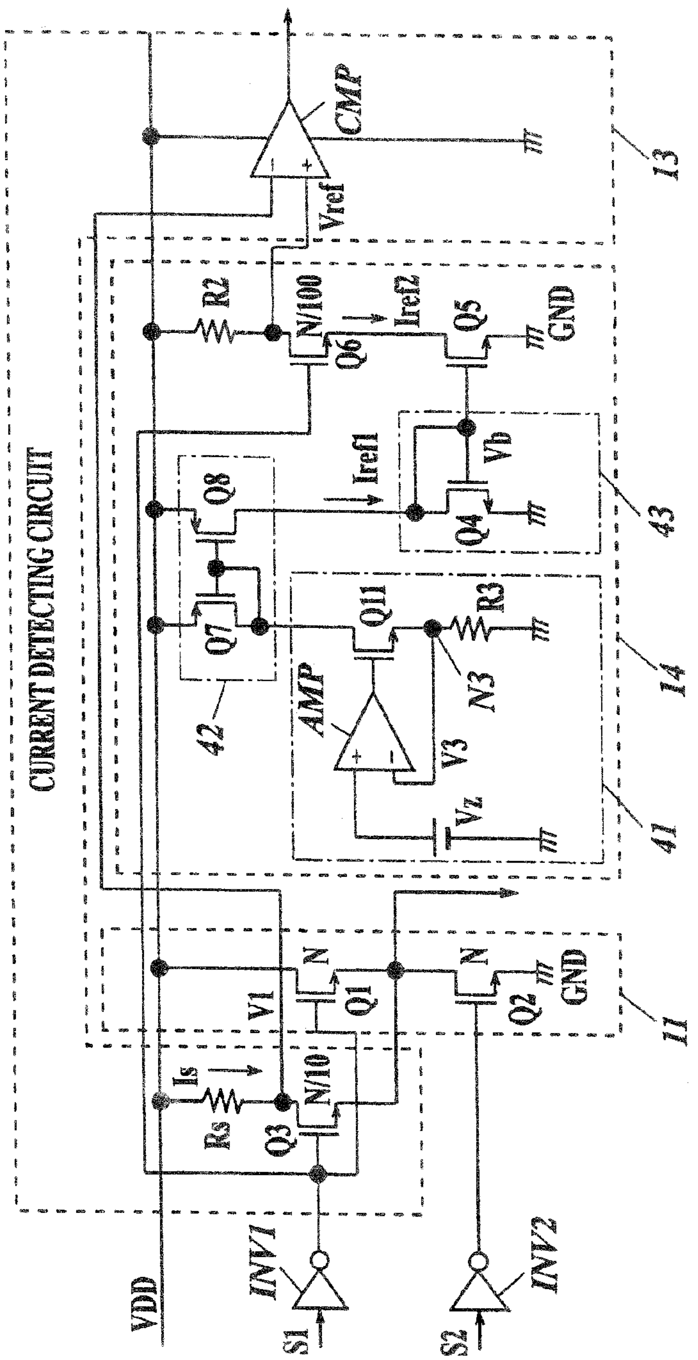
FIG. 2 is a circuit diagram showing a second embodiment of the transmission circuit to which the present invention is applied.

FIG. 2 shows the transmission circuit of the second embodiment. In the present embodiment, a MOS transistor Q6 having a gate terminal, to which a voltage same as that applied to the gate terminal of the MOS transistor Q3 in the output current detecting circuit 13 is applied, is serially connected between the resistor R2 generating the reference voltage Vref by its voltage drop and the MOS transistor Q5 generating the current Iref2 flowing through the resistor R2.

Furthermore, the reference voltage generating circuit 14 is equipped with a constant current source circuit 41 including an operational amplifier AMP having a non-inverting input terminal, to which a standard voltage source Vz having no temperature characteristics is connected; a cascode type current mirror circuit 42 flowing a constant current in proportion to the constant current flowing through the constant current source circuit 41; and the MOS transistor Q4 as a current-voltage conversion circuit 43 converting the current output from the current mirror circuit 42 into a voltage to generate the gate bias voltage Vb of the MOS transistor Q5. The constant current source circuit 41, the current mirror circuit 42, and the current-voltage conversion circuit 43 constitute a constant voltage circuit as a bias circuit.

The current mirror circuit 42 is composed of a pair of p-channel type MOS transistors Q7 and Q8, the gates of which are commonly connected. The constant current source circuit 41 is composed of the operational amplifier AMP having the non-inverting input terminal, to which the standard voltage source Vz having no temperature characteristics is connected; an n-channel type MOS transistor Q11 connected to the MOS transistor Q7 of the current mirror circuit 42 in series with each other, the MOS transistor Q11 having a gate terminal, to which the output of the operational amplifier AMP is applied; and a resistor R3 connected between the source terminal of the MOS transistor Q11 and the ground point. The electric potential V3 at the connection node N3 of the MOS transistor Q11 and the resistor R3 is fed back to the inverting input terminal of the operational amplifier AMP, and thereby the operational amplifier AMP drives the MOS transistor Q11 in such a way that the electric potential V3 at the node N3 agrees with the standard voltage Vz.

As a result, the MOS transistor Q11 is made to flow a constant collector current independent of the power source voltage, and the operational amplifier AMP, the transistor Q11, and the resistor R3 result in operating as a constant current source. Because the reference voltage generating circuit 14 is configured in such a way that the constant current generated by the constant current source circuit 41 is reflected by the current mirror circuit 42 and the current-voltage conversion circuit 43 including the MOS transistor Q4 connected in a diode connection generates the bias voltage Vb, the bias voltage Vb having low power source voltage dependency can be generated, and the power source voltage dependency of the current Iref2 flowing through the resistor R2, the reference voltage Vref by extension, can consequently be reduced. In addition, the current mirror circuit 42 may be configured as the so-called cascode type current mirror circuit, in which the pair of p-channel type MOS transistors Q7 and Q8, the gates of which are commonly connected to each other, is serially connected to a pair of p-channel type MOS transistors, the gates of which are similarly commonly connected to each other.

Moreover, the transmission circuit of FIG. 2 is designed in such a way that the MOS transistor Q6 having the gate terminal, to which the voltage same as the gate voltage of the current detecting MOS transistor Q3 is applied, is connected between the resistor R2 and the MOS transistor Q5 and the current densities of the MOS transistors Q3 and Q6 become the same at the time of detecting an excess current. Hereby, the variations of the current Iref2 caused by the variations of the drain-source voltage of the MOS transistor Q6 can be made to be the characteristic same as that of the variations of the current Is caused by the variations of the drain-source voltage VDS of the MOS transistor Q3, and consequently the transmission circuit has the advantage that the variations of the current Iref2, the variations of the reference voltage Vref by extension, can be made to be smaller than the variations of the power supply voltage.

Because the resistor R2 generating the reference voltage Vref, however, has a temperature coefficient in the transmission circuit of FIG. 2, it is apprehended that a temperature change causes change of the reference voltage Vref. To put it concretely, when the current flowing through the resistor Rs of the output current detecting circuit 13 is dented by Is, the electric potential V1 at the connection node N1 of the resistor Rs and the current detecting MOS transistor Q3 can be expressed by V1=Is×Rs, and the reference voltage Vref can be expressed as Vref=Iref2×R2. Because the current Is is a current in proportion to the output current Iout here, the current Is has no temperature dependency. Accordingly, if the resistance elements of the same type (having the same temperature coefficients) formed by the same process are used as the resistors Rs and R2, the reference voltage Vref is led to have the temperature dependency that is determined only by the temperature coefficient of the current Iref2 flowing through the resistor R2.

On the other hand, the temperature coefficient of the current Iref2 depends on the temperature coefficient of the current Iref1 of the bias circuit, and the current Iref1 is expressed by Iref1=Vz/R3. Consequently, the temperature coefficient of the current Iref2 is led to depend on the temperature coefficient of the resistor R3. Consequently, the temperature dependency of the reference voltage Vref can be removed by devising the method of cancelling the temperature coefficient of the resistor R3 in the bias circuit.

Figure 5:
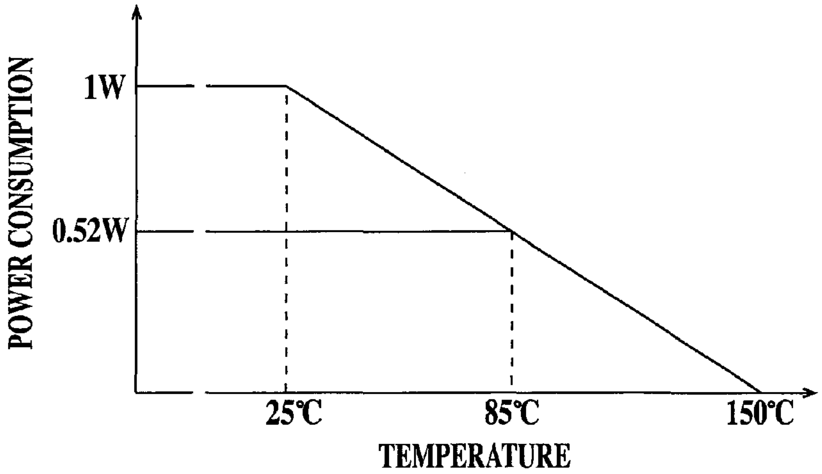
FIG. 5 is a characteristic diagram showing a relation between the temperatures of a package the use of which the inventors of the present invention examined and allowable power consumption.

However, it is sometimes required to give a negative temperature characteristic, that is, to lower the excess current detection level (reference voltage) as a chip temperature becomes higher, to an excess current detection level owing to the property (Pd value=allowable loss) of a semiconductor package to be used. For example, as shown in FIG. 5, the allowable power consumption of the package that the inventors of the present invention examined the use thereof lowered as the temperature became higher. Consequently, it heighten the safety of the current detecting circuit of the transmission circuit of the driver/receiver IC using such a package to lower the excess current detection level as a temperature becomes higher. The inventors judged it to be desirable to give a negative temperature characteristic to the reference voltage Vref, that is, the current Iref2 flowing through the resistor R2 for lowering the excess current detection level.

Next, a modification that enables a user to arbitrarily set the temperature coefficient of the current Iref2 in the reference voltage generating circuit of FIG. 2 will be described.

Figure 3:
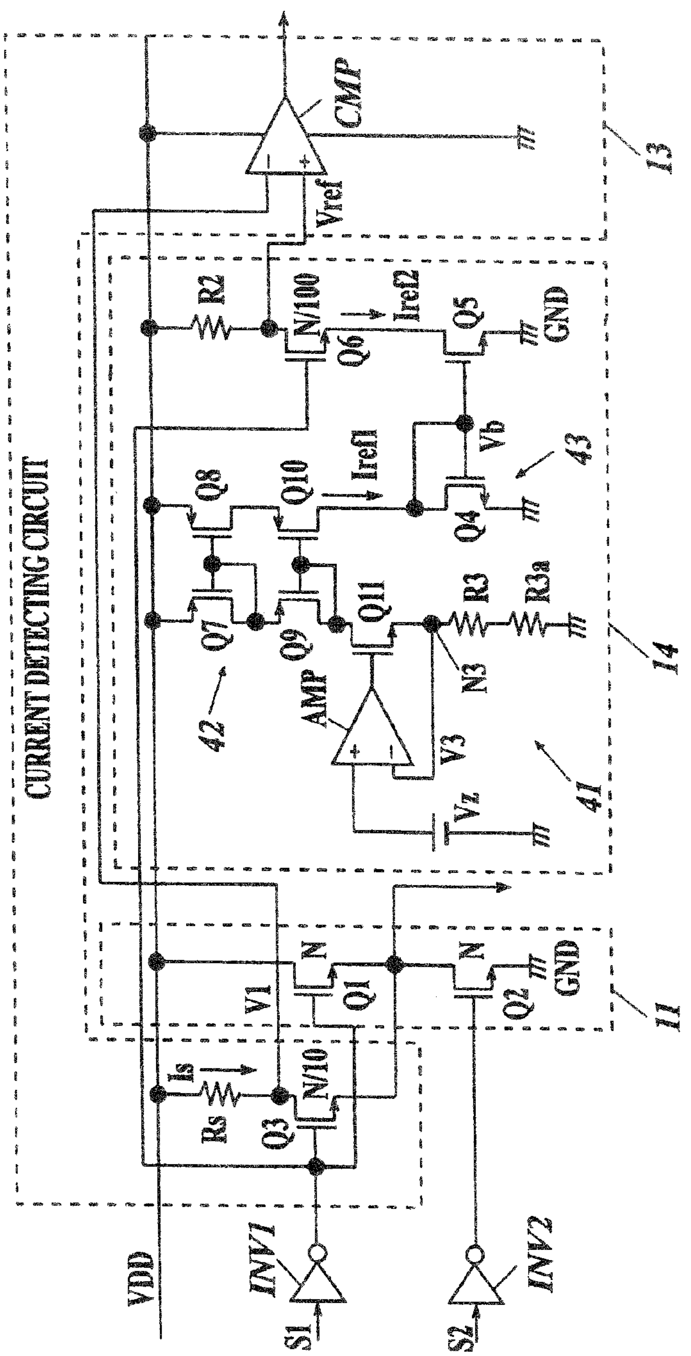
FIG. 3 is a circuit diagram showing a first modification of the transmission circuit of the second embodiment.

The circuit of FIG. 3 uses the so-called cascode type current mirror circuit, in which the pair of p-channel type MOS transistors Q7 and Q8 in gate common connection and a pair of p-channel type MOS transistors Q9 and Q10 similarly in gate common connection are serially connected to each other, as the current mirror circuit 42 in the reference voltage generating circuit 14 in FIG. 2, and adds a resistor R3*a* in series with the resistor R3 constituting the constant current source circuit 41.

In this circuit, the use of the cascode type current mirror circuit improves the power source voltage dependency of the currents Iref1 and Iref2. A resistor having a positive temperature coefficient is used as the resistor R3, and a resistor having a negative temperature coefficient is used as the added resistor R3*a*. Thereby, the temperature characteristics of the two resistors offset each other to makes it possible to make the temperature coefficients of the currents Iref1 and Iref2 zero. Furthermore, if it is desired to give negative temperature coefficients to the currents Iref1 and Iref2, it is only necessary to design the constant current source circuit 41 to remove the resistor R3 having the positive temperature coefficient and only to connect the resistor R3*a* having the negative temperature coefficient.

In addition, if it is desired to make the temperature coefficient of the current Iref1 zero, it is also possible to make the currents Iref1 and Iref2 have no temperature characteristics by changing the whole of the constant current source circuit 41 to, for example, a constant current source circuit configured to offset the positive temperature characteristic of the resistor element by the negative temperature characteristic of the base-emitter voltage VBE of a bipolar transistor in place of giving the negative temperature coefficient to the resistor R3*a* serially connected to the resistor R3.

Figure 4:
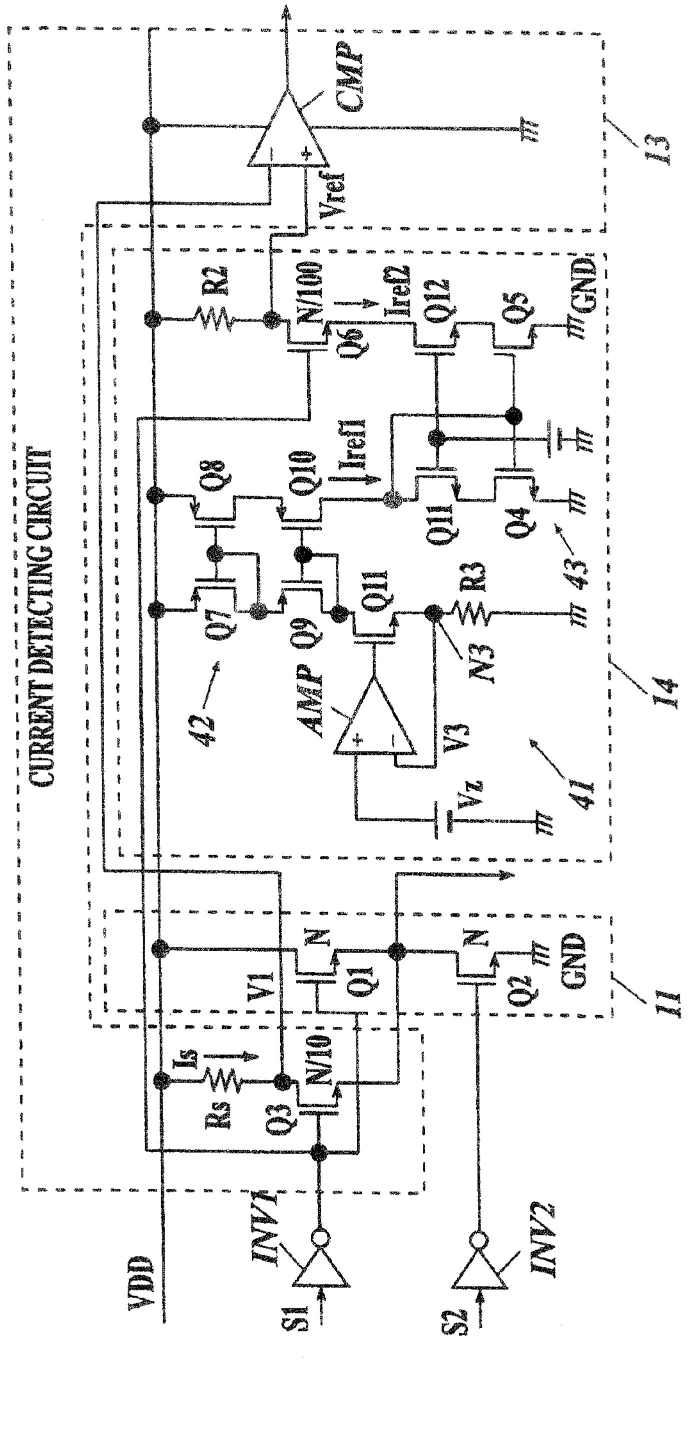
FIG. 4 is a circuit diagram showing a second modification of the transmission circuit of the second embodiment.

FIG. 4 shows a second modification of the output current detecting circuit.

The circuit of FIG. 4 uses a cascode type current mirror circuit (Q11, Q12 and Q4, Q5), in which two pairs of MOS transistors in gate common connections in each pair are cascaded, as the current-voltage conversion circuit 43 and a constant current circuit receiving the bias voltage from the current-voltage conversion circuit 43 to flow a constant current in the reference voltage generating circuit 14 of FIG. 2. By adopting the circuit having such a configuration, the voltage characteristic of the current Iref2 can be improved, that is, the power source voltage dependency can furthermore be reduced.

In the above, the invention made by the present inventors has concretely been described on the basis of the embodiments, but the scope of the present invention is not limited to the aforesaid embodiments. For example, the invention may be configured to use a comparator having a hysteresis characteristic as the comparator CMP used in the embodiments.

Furthermore, although the sensing resistor Rs and the current detecting transistor Q3 are provided in parallel with the transistor Q1 on the side of the power source voltage VDD among the output transistors Q1 and Q2 in each of the aforesaid embodiments, the sensing resistor Rs and the current detecting transistor Q3 may be provided in parallel with the transistor Q2 on the side of the ground potential. Then, in that case, the reference voltage generating circuit 14 may be configured to generate the reference voltage Vref based on the ground potential.

Furthermore, although the case where the invention made by the present inventors is applied to the output current detecting circuit to be used in a transmission circuit incorporated in an HBC driver/receiver IC, which is the application field of the background of the invention, has been described in the above description, the present invention can widely be used in an output current detecting circuit in an output circuit driving a load with a current.

The entire disclosure of Japanese Patent Application No. 2009-259467 filed on Nov. 13, 2009 including description, claims, drawings, and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. An output current detecting circuit, comprising:

an output circuit including an output transistor connected between a power source voltage terminal and an output terminal;

a current detecting transistor having a size smaller than a size of the output transistor, and a control terminal, to which a voltage is applied that is the same as a voltage applied to a control terminal of the output transistor, to flow a current according to the size of the current detecting resistor through the current detecting transistor;

a first resistance element connected to the current detecting transistor in a serial mode;

a comparison circuit for comparing a voltage converted by the first resistance element and a predetermined reference voltage to judge a magnitude of a current flowing through the output transistor; and a reference voltage generating circuit for generating the reference voltage, wherein the reference voltage generating circuit includes a constant current circuit flowing a constant current and a second resistance element having one terminal connected to the power source voltage terminal, the reference voltage generating circuit generating the reference voltage based on a power source voltage at the power source voltage terminal by converting the constant current generated by the constant current circuit into a voltage by flowing the constant current through the second resistance element, and wherein the output current detecting circuit further comprises a first MOS transistor connected between the constant current circuit and the second resistance element, the first MOS transistor having a gate terminal to which a voltage is applied that is the same as the voltage applied to the control terminal of the current detecting transistor.

2. The output current detecting circuit according to claim 1, wherein each of the output transistor and the current detecting transistor is made of an n-channel type field-effect transistor.

3. The output current detecting circuit according to claim 2, wherein the constant current circuit includes:

a second MOS transistor serially connected to the second resistance element and the first MOS transistor;

a current mirror circuit connected to a constant current source and the power source voltage terminal, through which current mirror circuit a current flows in proportion to a current of the constant current source; and a current-voltage conversion circuit for converting a current transferred by the current mirror circuit into a voltage to generate a bias voltage to be applied to a gate terminal of the second MOS transistor.

4. The output current detecting circuit according to claim 3, wherein the constant current source includes:

an operational amplifier having a first input terminal to which a standard voltage having no temperature characteristic is applied; and a third MOS transistor and a third resistance element serially connected between a transistor of a transfer source of the current mirror circuit and a constant potential point, wherein an output voltage of the operational amplifier is applied to a gate terminal of the third MOS transistor, and an electric potential at a connection node of the third MOS transistor and the third resistance element is fed back to a second input terminal of the operational amplifier.

5. The output current detecting circuit according to claim 4, wherein:

each of the first resistance element and the second resistance element is a resistor of a same type; and the current detecting transistor and the first MOS transistor are adapted to make currents having current densities that are the same as each other flow therethrough when an excess current state is detected by the comparison circuit.

6. A transmission circuit, comprising:

an output circuit including a first output transistor and a second output transistor connected between a power source voltage terminal and a constant potential point in a serial mode;

a gate control circuit for generating a pair of AMI-coded control signals to be supplied to control terminals of the first output transistor and the second output transistor, respectively;

a current detecting transistor having a size smaller than sizes of the output transistors, and a control terminal, to which a voltage is applied that is the same as voltages applied to the control terminals of the output transistors, to flow a current according to the size of the current detecting transistor through the current detecting transistor;

a first resistance element connected to the current detecting transistor in a serial mode;

a comparison circuit for comparing a voltage converted by the first resistance element and a predetermined reference voltage to judge a magnitude of a current flowing through the output transistors; and a reference voltage generating circuit for generating the reference voltage, wherein:

the reference voltage generating circuit includes a constant current circuit flowing a constant current and a second resistance element having one terminal connected to the power source voltage terminal, the reference voltage generating circuit generating the reference voltage based on a power source voltage to be applied to the power source voltage terminal by converting the constant current generated by the constant current circuit into a voltage by flowing the constant current through the second resistance element;

an output of the comparison circuit is supplied to the gate control circuit, which generates control signals for turning off both the first output transistor and the second output transistor when the current flowing through the output transistors exceeds a predetermined current value; and the transmission circuit further comprises a first MOS transistor connected between the constant current circuit and the second resistance element, the first MOS transistor having a gate terminal to which a voltage is applied that is the same as the voltage applied to the control terminal of the current detecting transistor.

* * * * *